(12) United States Patent
Mitsuishi et al.

(10) Patent No.: US 8,471,277 B2
(45) Date of Patent: *Jun. 25, 2013

(54) LIGHT EMITTING DEVICE

(75) Inventors: Iwao Mitsuishi, Tokyo (JP); Shinya Nunoue, Chiba (JP); Takahiro Sato, Kanagawa (JP); Yumi Fukuda, Tokyo (JP); Aoi Okada, Tokyo (JP); Naotoshi Matsuda, Kanagawa (JP); Toshiki Hikosaka, Kanagawa (JP); Keiko Albessard, Kanagawa (JP); Masahiro Kato, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 122 days.

This patent is subject to a terminal disclaimer.

(21) Appl. No.: 13/214,377

(22) Filed: Aug. 22, 2011

(65) Prior Publication Data

US 2012/0056224 A1 Mar. 8, 2012

(30) Foreign Application Priority Data

Sep. 8, 2010 (JP) .................................. 2010-201336
Aug. 16, 2011 (JP) .................................. 2011-177805

(51) Int. Cl.
*H01L 29/20* (2006.01)
*H01L 33/00* (2010.01)
*H01J 1/62* (2006.01)

(52) U.S. Cl.
USPC .......... 257/89; 257/98; 257/E33.06; 313/503; 313/486; 313/487

(58) Field of Classification Search
None
See application file for complete search history.

(56) References Cited

U.S. PATENT DOCUMENTS

| 7,524,437 | B2 * | 4/2009 | Sakane et al. ........... 252/301.4 F |
| 7,884,538 | B2 | 2/2011 | Mitsuishi et al. |
| 2009/0096361 | A1 | 4/2009 | Fukuda |
| 2009/0236963 | A1 | 9/2009 | Nagatomi et al. |
| 2010/0025632 | A1 | 2/2010 | Fukuda |
| 2010/0102707 | A1 | 4/2010 | Fukuda |
| 2010/0200874 | A1 * | 8/2010 | Shioi et al. ...................... 257/91 |
| 2011/0204769 | A1 | 8/2011 | Fukuda |

FOREIGN PATENT DOCUMENTS

| JP | 2006-008862 | A | 1/2006 |
| JP | 2007-180483 | | 7/2007 |
| JP | 2008-81631 | | 4/2008 |
| JP | 2009-49000 | | 3/2009 |
| JP | 2010-31201 | A | 2/2010 |
| JP | 2010-31201 | A5 | 2/2010 |
| JP | 2010-106127 | A | 5/2010 |

(Continued)

OTHER PUBLICATIONS

Office Action issued Nov. 22, 2011, in Japanese Patent Application No. 2011-177805 (with English-language translation).

(Continued)

*Primary Examiner* — Davienne Monbleau
*Assistant Examiner* — Moazzam Hossain
(74) *Attorney, Agent, or Firm* — Oblon, Spivak, McClelland, Maier & Neustadt, L.L.P.

(57) ABSTRACT

A light emitting device according to one embodiment includes a light emitting element that emits light having a wavelength of 380 nm to 470 nm; a CASN first red phosphor that is disposed on the light emitting element; a sialon second red phosphor that is disposed on the light emitting element; and a sialon green phosphor that is disposed on the light emitting element.

20 Claims, 7 Drawing Sheets

FOREIGN PATENT DOCUMENTS

| | | |
|---|---|---|
| JP | 2010-106127 A5 | 5/2010 |
| JP | 2010-147306 | 7/2010 |
| WO | WO 2006/093298 A1 | 9/2006 |

OTHER PUBLICATIONS

U.S. Appl. No. 13/034,120, filed Feb. 24, 2011, Mitsuishi, et al.
Japanese Office Action issued Apr. 10, 2012, in Japan Patent Application No. 2011-177805 (with English translation).
U.S. Appl. No. 13/034,137, filed Feb. 24, 2011, Mitsuishi.
U.S. Appl. No. 7,884,538, filed Feb. 8, 2011, Mitsuishi.
U.S. Appl. No. 13/037,635, filed Mar. 1, 2011, Okada.
U.S. Appl. No. 13/033,917, filed Feb. 24, 2011, Mitsuishi.
U.S. Appl. No. 13/033,954, filed Feb. 24, 2011, Mitsuishi.
U.S. Appl. No. 13/033,960, filed Feb. 24, 2011, Mitsuishi.
U.S. Appl. No. 13/039,082, filed Mar. 2, 2011, Kato.
U.S. Appl. No. 13/216,860, filed Aug. 24, 2011, Fukuda.
Office Action issued Mar. 26, 2013, in Japanese Patent Application No. 2011-177805, filed Aug. 16, 2011 (with English-language Translation), 8 pages.

* cited by examiner

LIGHT EMITTING DEVICE

CROSS-REFERENCE TO RELATED APPLICATION

This application is based upon and claims the benefit of priority from Japanese Patent Application No. 2010-201336, filed on Sep. 8, 2010, and No. 2011-177805, filed on Aug. 16, 2011; the entire contents of which are incorporated herein by reference.

FIELD

Embodiments described herein relate generally to a light emitting device.

BACKGROUND

Recently, attention focuses on a so-called white-color Light Emitting Device (LED) in which a yellow phosphor such as YAG:Ce is combined with a blue LED to emit white-color light by single chip. Conventionally, the LED emits red, green, or blue light in monochromatic form, and it is necessary that plural LEDs emitting monochrome wavelengths are driven in order to emit the white-color light or intermediate-color light. However, currently, the combination of the light emitting diode and the phosphor realizes the white-color light with a simple structure.

However, in the white-color light emitting diode in which the YAG:Ce phosphor is combined with the blue light emitting diode, pale light emission is generated because of a lack of a red component, and a color rendering property is biased. Therefore, there is discussed a white-color light emitting diode in which the red component lacking in YAG:Ce is compensated by another red phosphor having a peak wavelength of about 640 nm to about 660 nm.

DETAILED DESCRIPTION

A light emitting device according to one embodiment includes a light emitting element that emits light having a wavelength of 380 nm to 470 nm; a first red phosphor that is disposed on the light emitting element, the first red phosphor having a composition expressed by the following equation (1); a second red phosphor that is disposed on the light emitting element, the second red phosphor having a composition expressed by the following equation (2); and a green phosphor that is disposed on the light emitting element, the green phosphor having a composition expressed by the following equation (3).

(In the equation (1), x1, a1, b1, c1 and d1 satisfy the following relationship. $0<x1<0.03$, $0.90<a1<1.1$, $0.90<b1<1.1$, $0.20<c1<0.45$, $2.40<d1\leq3.00$)

(In the equation (2), x2, a2, b2, c2, and d2 satisfy the following relationship. $0<x2<1$, $0.55<a2<0.95$, $2.0<b2<3.9$, $0<c2<0.6$, $4<d2<5.7$)

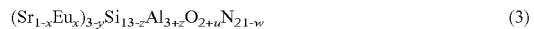

(In the equation (3), x, y, z, u, and w satisfy the following relationship. $0<x<1$, $-0.1<y<0.3$, $-3<z\leq1$, $-3<u-w\leq1.5$, where $-2\leq u$ and $w\leq 21$ so that in equation (3), O and N are not below zero in amount.)

Embodiments will be described below with reference to the drawings.

In the following description, a color rendering property is based on an evaluation method defined by JISZ8726.

Figure 11:
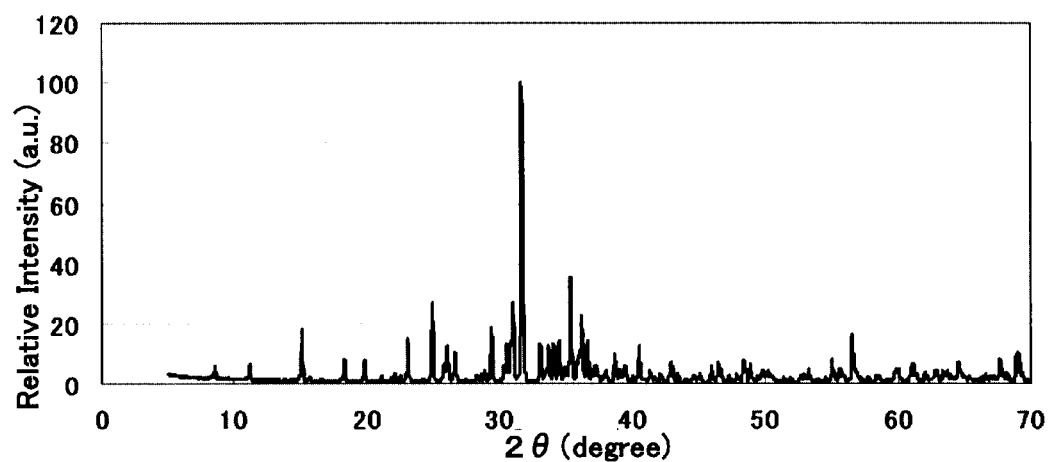
FIG. 11 is a XRD profile of the red phosphor of the example 17.
Figure 12:
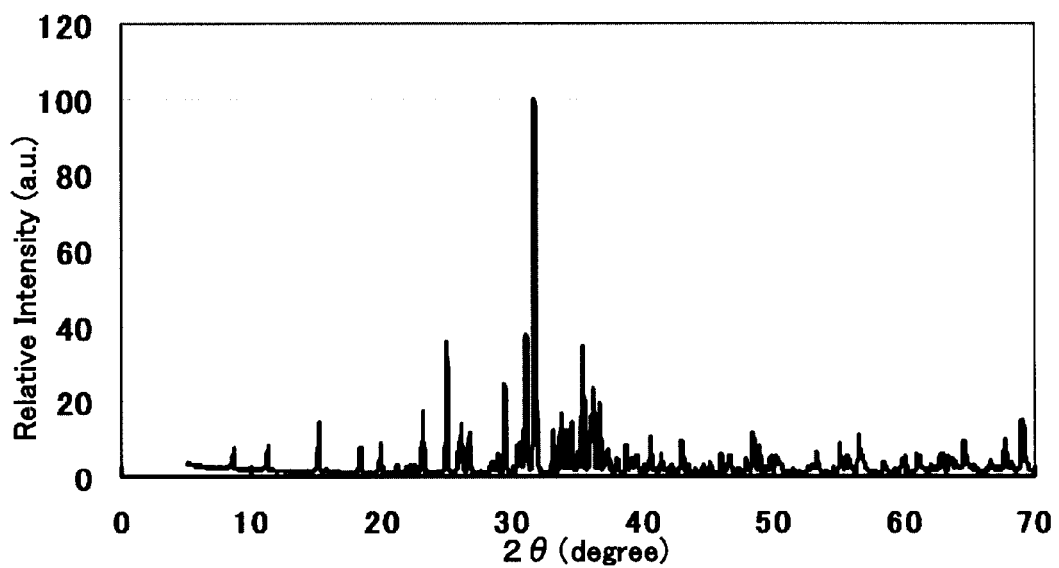
FIG. 12 is a XRD profile of the red phosphor of the example 18.

The red phosphors expressed by the above-described equation (2) of the embodiments have orthorhombic crystal structure. As shown in FIGS. 11, 12, the red phosphors include a component which shows diffraction peaks in at least 9 diffraction degree (2θ (two theta)) ranges simultaneously among 11 ranges listed below under X-ray diffraction analysis using CuKα characteristic X-ray (wave length of 1.54056 angstroms). The 11 diffraction degree (2θ (two theta)) ranges are, 31.6-31.8°, 30.9-31.1°, 24.85-25.05°, 35.25-35.45°, 15.0-15.25°, 56.4-56.65°, 36.1-36.25°, 33.0-33.20°, 23.1-23.20°, 29.3-29.6°, 26.95-26.15°.

Figure 13:
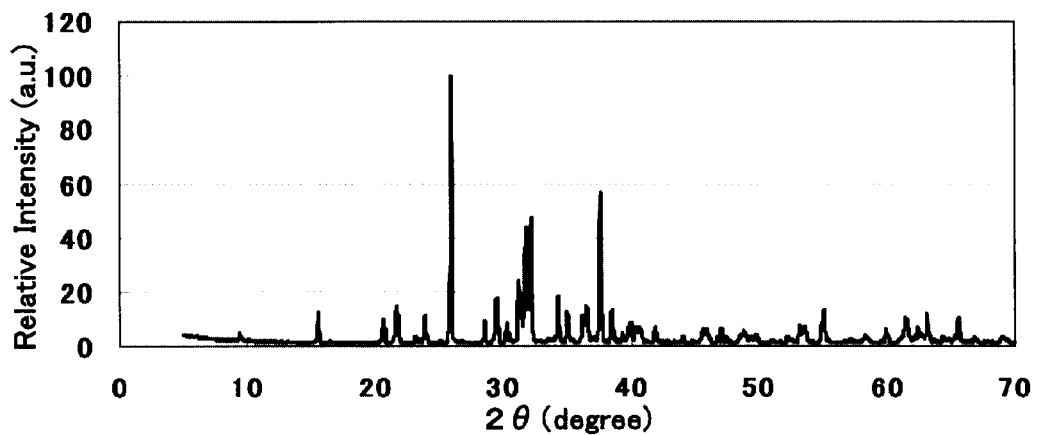
FIG. 13 is a XRD profile of the green phosphor of the example 3.
Figure 14:
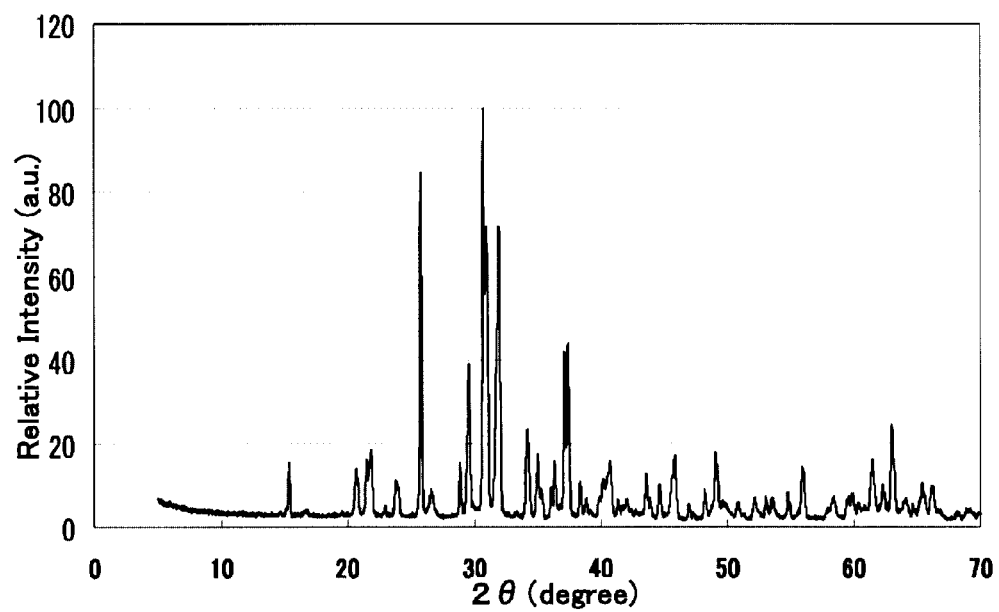
FIG. 14 is a XRD profile of the green phosphor of the example 17.

And the green phosphors expressed by the above-described equation (3) of the embodiments have orthorhombic crystal structure. As shown in FIGS. 13, 14, the green phosphors include a component which shows diffraction peaks in at least 6 diffraction degree (2θ (two theta)) ranges simultaneously among 15 ranges listed below under X-ray diffraction analysis using CuKα characteristic X-ray (wave length of 1.54056 angstroms). The 15 diffraction degree (2θ (two theta)) ranges are, 30.5-30.9°, 25.6-30.0°, 31.8-32.2°, 37.2-37.6°, 37.0-37.4°, 29.3-29.7°, 34.0-34.4°, 21.7-22.1°, 48.9-49.3°, 45.7-46.1°, 62.8-63.2°, 15.2-15.6°, 61.3-61.7°, 40.5-40.9°, 55.8°-56.2°.

First Embodiment

Figure 1:
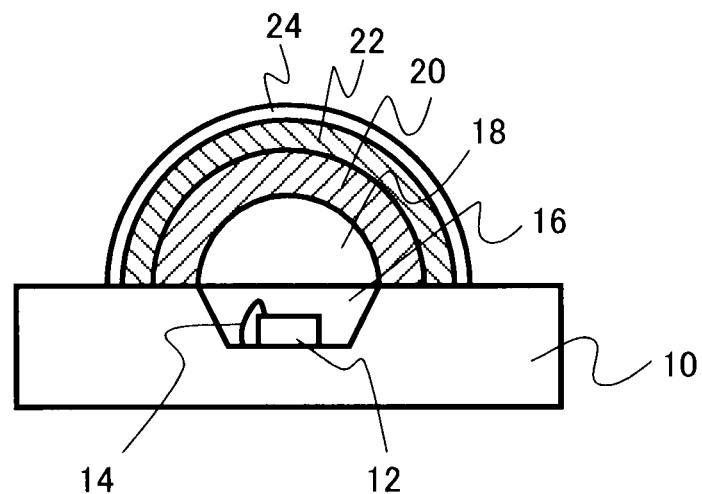
FIG. 1 is a schematic sectional view illustrating a light emitting device according to a first embodiment.

FIG. 1 is a schematic perspective view illustrating a light emitting device according to a first embodiment. The light emitting device of the first embodiment includes a blue LED chip 12 for excitation light source as the light emitting element, and the blue LED chip 12 is mounted on a board 10 having a recess. The blue LED chip 12 emits blue light having a wavelength of 440 nm to 470 nm.

For example, the LED chip 12 is connected to wiring (not illustrated) through a gold wire 14. A driving current is supplied to the LED chip 12 from the outside through the wiring, whereby the LED chip 12 emits the blue light for excitation.

The LED chip 12 is sealed in the recess of the board 10 by a transparent resin layer 16. A hemispherical transparent resin layer 18 is provided on the LED chip 12 such that the transparent resin layer 16 is covered with the transparent resin 18.

A red fluorescent layer 20 is formed or disposed on the LED chip 12. And the red fluorescent layer 20 is disposed on the transparent resin layer 18. The red fluorescent layer absorbs the blue light emitted from the LED chip 12 and converts the blue light into red light. In the red fluorescent layer 20, the first red phosphor having the composition expressed by the equation (1) and the second red phosphor having the composition expressed by the equation (2) are dispersed in a transparent resin while mixed together.

$$(Ca_{1-x1}Eu_{x1})_{a1}AlSi_{b1}O_{c1}N_{d1}:Eu \quad (1)$$

(In the equation (1), x1, a1, b1, c1 and d1 satisfy the following relationship. $0<x1<0.03$, $0.90<a1<1.1$, $0.90<b1<1.1$, $0.20<c1<0.45$, $2.40<d1\leq3.00$)

$$(Sr_{1-x2}Eu_{x2})_{a2}Si_{b2}AlO_{c2}N_{d2} \quad (2)$$

(In the equation (2), x2, a2, b2, c2, and d2 satisfy the following relationship. $0<x2<1$, $0.55<a2<0.95$, $2.0<b2<3.9$, $0<c2<0.6$, $4<d2<5.7$)

The first red phosphor is a so called CASN phosphor. When excited by the blue light having the wavelength of 380 nm to 470 nm, the first red phosphor emits the red light having a peak at the wavelength of 640 nm to 660 nm.

The second red phosphor is a so called sialon phosphor. When excited by the blue light having the wavelength of 380 nm to 470 nm, the second red phosphor emits the red light having a peak at the wavelength of 590 nm to 640 nm.

From the viewpoint of realizing the higher color rendering property, in the second red phosphor, in the equation (2), desirably x2, a2, b2, c2, and d2 satisfy the relationship of $0.01<x2\leq0.10$, $0.58\leq a2\leq0.70$, $2.1\leq b2 3.5$, $0.1\leq c2\leq0.5$, $4.1\leq d2\leq5.0$.

A green fluorescent layer 22 is provided such that the red fluorescent layer 20 is covered therewith. A green fluorescent layer 22 is formed or disposed on the red fluorescent layer 20. In the green fluorescent layer 22, a green phosphor is dispersed in a transparent resin, and the green phosphor absorbs the blue light emitted from the LED chip 12 and converts the blue light into green light. In the green fluorescent layer 22, the green phosphor having the composition expressed by the equation (3) is dispersed in the transparent resin.

$$(Sr_{1-x}Eu_x)_{3-y}Si_{13-z}Al_{3+z}O_{2+u}N_{21-w} \quad (3)$$

(In the equation (3), x, y, z, u, and w satisfy the following relationship. $0<x<1$, $-0.1<y<0.3$, $-3<z\leq1$, $-3<u-w\leq1.5$, where $-2\leq u$ and $w\leq21$ so that in equation (3), O and N are not below zero in amount.)

The green phosphor is a sialon phosphor. When excited by the blue light having the wavelength of 380 nm to 470 nm, the green phosphor emits the green light having a peak at the wavelength of 510 nm to 530 nm, for example.

A transparent resin layer 24 is provided such that the green fluorescent layer 22 is covered therewith. An outer surface of the transparent resin layer 24 is in contact with an atmosphere (air).

The transparent resin layer 24 has a function of suppressing total reflection of the blue light emitted from the LED chip 12, the red light from the red fluorescent layer 20, and the green light from the green fluorescent layer 22 at the outer surface that becomes an interface with the atmosphere.

A stacked film having a four-layer structure including the transparent resin layer 18, the red fluorescent layer 20, the green fluorescent layer 22, and the transparent resin layer 24 has a hemispherical shape.

According to the first embodiment, because particularly the two kinds of phosphors, that is, the so-called CASN phosphor and sialon phosphor are used as the red fluorescent, the color rendering property is realized as high as an average color rendering index Ra of 95 for a white color (4200 K) and an warm-white color (2800 K). Particularly the high color rendering property is realized for special color rendering indexes R9 and R15.

A transparent resin layer that suppresses re-absorption of the green light by the fluorescent layer 20 may further be provided between the red fluorescent layer 20 and the green fluorescent layer 22.

A yellow fluorescent layer in which a yellow phosphor is dispersed in a resin may further be provided between the red fluorescent layer 20 and the green fluorescent layer 22 in order to realize the higher color rendering property.

As illustrated in FIG. 1, the hemispherical stacked film having the four-layer structure including the transparent resin layer 18, the red fluorescent layer 20, the green fluorescent layer 22, and the transparent resin layer 24 is disposed on each LED chip 12. Therefore, for example, the white-color LED driven by a rated current 20 mA or a high-power white-color LED driven by a rated current 350 mA are implemented.

Second Embodiment

A light emitting device according to a second embodiment differs from the light emitting device of the first embodiment only in that the first red phosphor as the first red fluorescent layer is disposed on the light emitting element, the second red phosphor as the second red fluorescent layer on the first red fluorescent layer is disposed on the light emitting element, and the green phosphor as the green fluorescent layer on the second red fluorescent layer is disposed on the light emitting element. Therefore, the descriptions of the contents overlapped with those of the first embodiment are omitted.

Figure 2:
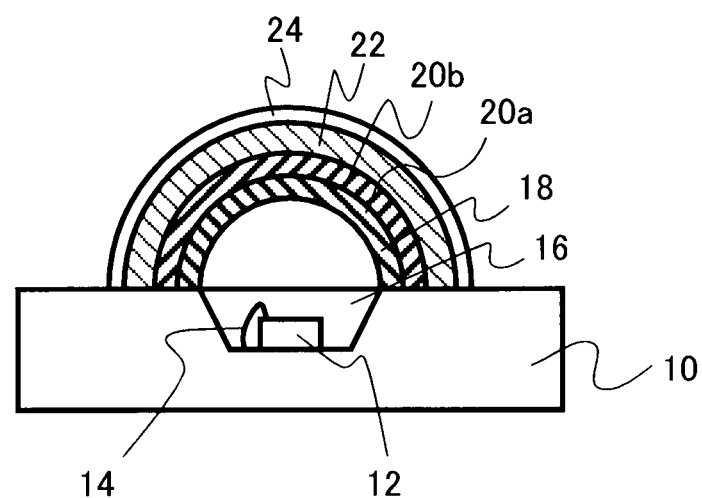
FIG. 2 is a schematic sectional view illustrating a light emitting device according to a second embodiment.

FIG. 2 is a schematic sectional view illustrating the light emitting device of the second embodiment. A first red fluorescent layer 20a in which the CASN red phosphor is dispersed in the resin is formed on the hemispherical transparent resin layer 18. The CASN red phosphor is expressed by the composition of the following equation (1). A second red fluorescent layer 20b in which the sialon red phosphor is dispersed in the resin is formed on the first red fluorescent layer 20a. The sialon red phosphor is expressed by the composition of the following equation (2).

$$(Ca_{1-x1}Eu_{x1})_{a1}AlSi_{b1}O_{c1}N_{d1}:Eu \quad (1)$$

(In the equation (1), x1, a1, b1, c1 and d1 satisfy the following relationship. $0<x1<0.03$, $0.90<a1<1.1$, $0.90<b1<1.1$, $0.20<c1<0.45$, $2.40<d1\leq3.00$)

$$(Sr_{1-x2}Eu_{x2})_{a2}Si_{b2}AlO_{c2}N_{d2} \quad (2)$$

(In the equation (2), x2, a2, b2, c2, and d2 satisfy the following relationship. $0<x2<1$, $0.55<a2<0.95$, $2.0<b2<3.9$, $0<c2<0.6$, $4<d2<5.7$)

According to the second embodiment, the red fluorescent layer is divided into two layers, which the first red phosphor to be prevented from absorbing the red light emitted from the second red phosphor. Accordingly, higher luminous efficiency can be realized in addition to the effect of the first embodiment.

Third Embodiment

A light emitting device according to a third embodiment differs from the light emitting device of the first embodiment only in that a transparent resin layer is further provided between the red fluorescent layer and the green fluorescent layer. Therefore, the descriptions of the contents overlapped with those of the first embodiment are omitted.

Figure 3:
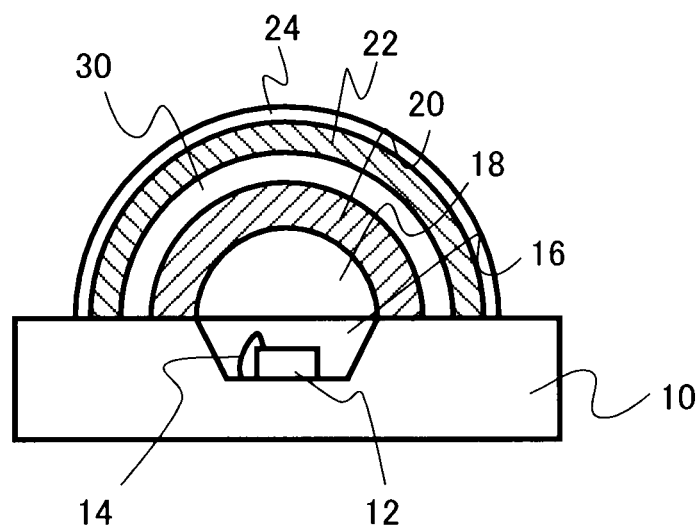
FIG. 3 is a schematic sectional view illustrating a light emitting device according to a third embodiment.

FIG. 3 is a schematic sectional view illustrating the light emitting device of the third embodiment. A transparent resin layer 30 is further provided between the red fluorescent layer 20 and the green fluorescent layer 22. The transparent resin layer 30 prevents the red fluorescent layer 20 from re-absorbing the green light emitted from the green fluorescent layer. Accordingly, the light emitting device in which the luminous efficiency is further improved compared with that of the first embodiment is implemented.

Fourth Embodiment

A light emitting device according to a fourth embodiment differs from the light emitting device of the second embodiment only in that a transparent resin layer is further provided between the second red fluorescent layer and the green fluorescent layer. Therefore, the descriptions of the contents overlapped with those of the second embodiment are omitted.

Figure 4:
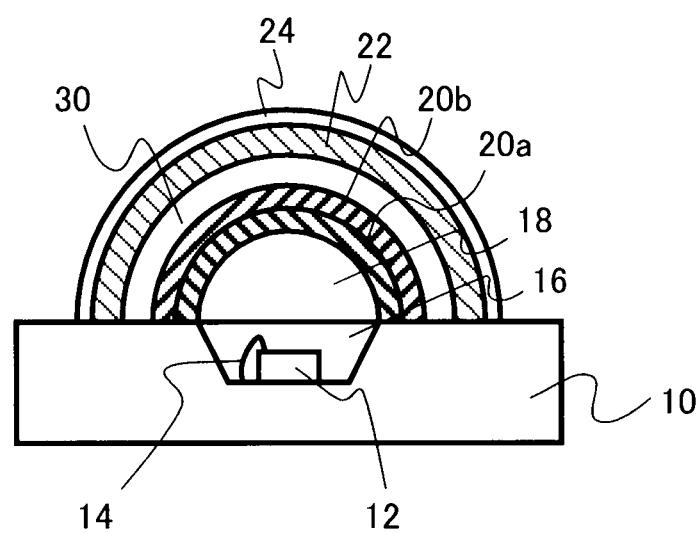
FIG. 4 is a schematic sectional view illustrating a light emitting device according to a fourth embodiment.

FIG. 4 is a schematic sectional view illustrating the light emitting device of the fourth embodiment. The transparent resin layer 30 is further provided between the second red fluorescent layer 20b and the green fluorescent layer 22. The transparent resin layer 30 prevents the first and second red fluorescent layers 20a and 20b from re-absorbing the green light emitted from the green fluorescent layer. Accordingly, the light emitting device in which the luminous efficiency is further improved compared with that of the second embodiment is implemented.

Fifth Embodiment

A light emitting device according to a fifth embodiment differs from the light emitting device of the third embodiment only in that the light emitting element is an LED that emits near-ultraviolet light having the wavelength of 380 nm to 420 nm and a blue fluorescent layer is provided instead of the transparent resin layer with which the green fluorescent layer is covered. Therefore, the descriptions of the contents overlapped with those of the third embodiment are omitted.

Figure 5:
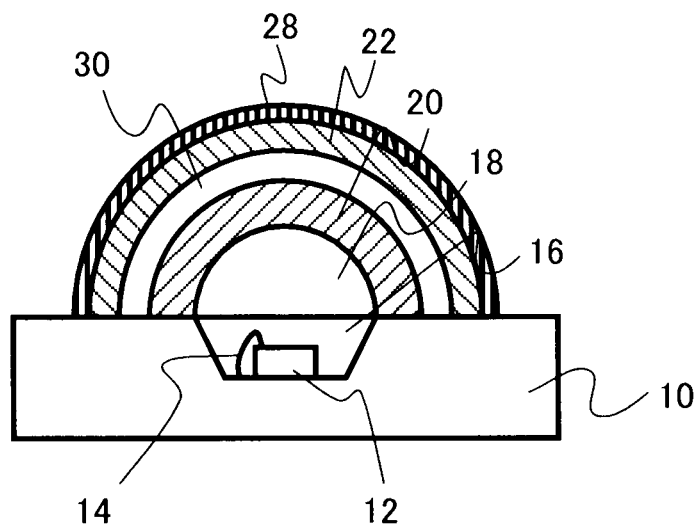
FIG. 5 is a schematic sectional view illustrating a light emitting device according to a fifth embodiment.

FIG. 5 is a schematic sectional view illustrating the light emitting device of the fifth embodiment. A blue fluorescent layer 28 is provided such that the green fluorescent layer 22 is covered therewith. The transparent resin layer 24 is provided such that the blue fluorescent layer 28 is covered therewith.

In the blue fluorescent layer 28, the blue phosphor is dispersed in the transparent resin, and the blue phosphor absorbs the ultraviolet light emitted from the LED chip 12 and converts the ultraviolet light into the bluelight. For example, an apatite phosphor or BAM:Eu can be used as the blue phosphor.

According to the fifth embodiment, the high color rendering property can be realized similar to the first to fourth embodiments.

Sixth Embodiment

A light emitting device according to a sixth embodiment differs from the light emitting device of the fourth embodiment only in that the light emitting element is the LED that emits the near-ultraviolet light having the wavelength of 380 nm to 420 nm and the blue fluorescent layer is provided instead of the transparent resin layer with which the green fluorescent layer is covered. Therefore, the descriptions of the contents overlapped with those of the fourth embodiment are omitted.

Figure 6:
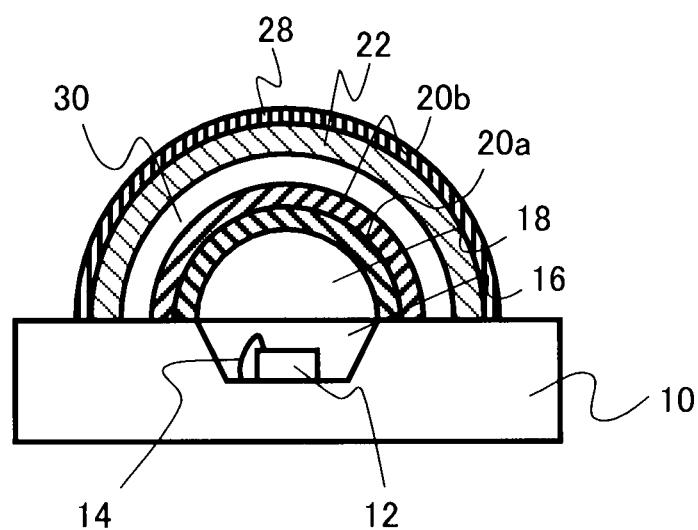
FIG. 6 is a schematic sectional view illustrating a light emitting device according to a sixth embodiment.

FIG. 6 is a schematic sectional view illustrating the light emitting device of the sixth embodiment. A blue fluorescent layer 28 is provided such that the green fluorescent layer 22 is covered therewith.

In the blue fluorescent layer 28, the blue phosphor is dispersed in the transparent resin, and the blue phosphor absorbs the ultraviolet light emitted from the LED chip 12 and converts the ultraviolet light into the blue light. For example, an apatite phosphor or BAM:Eu can be used as the blue phosphor.

According to the sixth embodiment, the high color rendering property can be realized similar to the first to fifth embodiments.

Seventh Embodiment

A light emitting device according to a seventh embodiment differs from the light emitting device of the fourth embodiment only in that the fluorescent layers and the transparent resin layer have not the hemispherical shape but a flat-plate shape. Therefore, the descriptions of the contents overlapped with those of the fourth embodiment are omitted.

Figure 7:
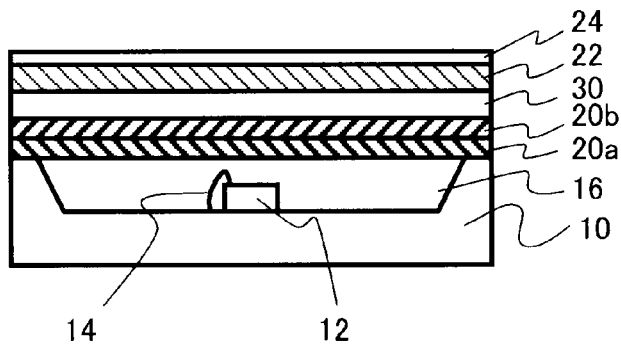
FIG. 7 is a schematic sectional view illustrating a light emitting device according to a seventh embodiment.

FIG. 7 is a schematic sectional view illustrating the light emitting device of the seventh embodiment. The transparent resin layer 30 is further provided between the second red fluorescent layer 20b and the green fluorescent layer 22. The transparent resin layer 30 prevents the first and second red fluorescent layers 20a and 20b from re-absorbing the green light emitted from the green fluorescent layer. The transparent resin layer 24 is provided such that the green fluorescent layer 22 is covered therewith.

According to the seventh embodiment, the high color rendering property can be realized similar to the first to sixth embodiments. Because the fluorescent resin application layer and the transparent resin layer are formed into the flat-plate shape, advantageously the light emitting device of the seventh embodiment is relatively easily produced.

Eighth Embodiment

Alight emitting device according to an eighth embodiment differs from the light emitting device of the fifth embodiment only in that the fluorescent layers and the transparent resin layer have not the hemispherical shape but the flat-plate shape. Therefore, the descriptions of the contents overlapped with those of the fifth embodiment are omitted.

Figure 8:
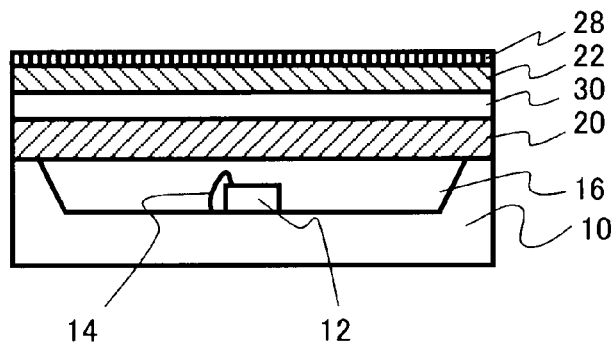
FIG. 8 is a schematic sectional view illustrating a light emitting device according to an eighth embodiment.

FIG. 8 is a schematic sectional view illustrating the light emitting device of the eighth embodiment. A blue fluorescent layer 28 is provided such that the green fluorescent layer 22 is covered therewith.

According to the eighth embodiment, the high color rendering property can be realized similar to the first to seventh embodiments. Because the fluorescent resin application layer and the transparent resin layer are formed into the flat-plate shape, advantageously the light emitting device of the eighth embodiment is relatively easily produced.

Ninth Embodiment

A light emitting device according to a ninth embodiment differs from the light emitting device of the sixth embodiment only in that the fluorescent layers and the transparent resin layer have not the hemispherical shape but the flat-plate shape. Therefore, the descriptions of the contents overlapped with those of the sixth embodiment are omitted.

Figure 9:
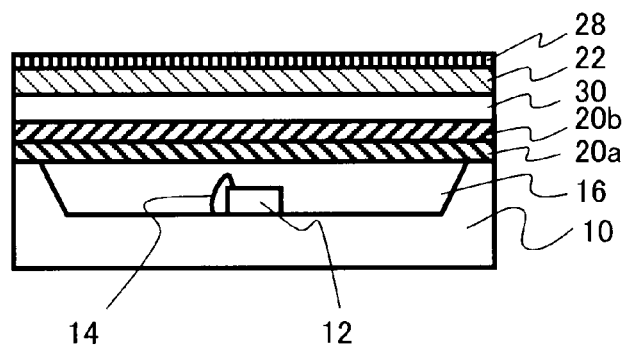
FIG. 9 is a schematic sectional view illustrating a light emitting device according to a ninth embodiment.
Figure 10:
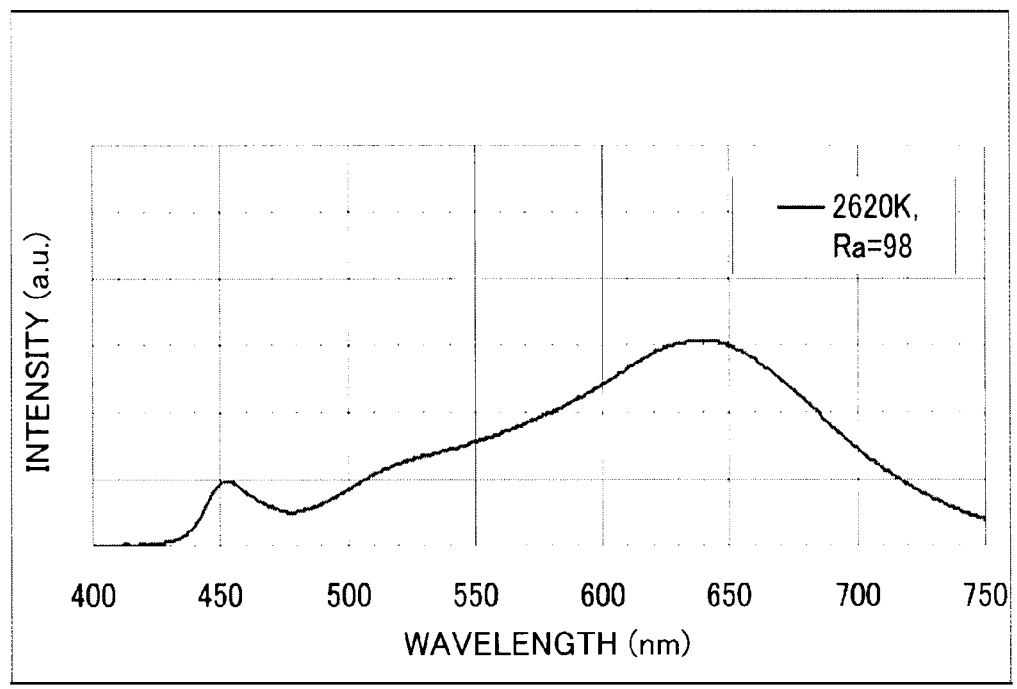
FIG. 10 is a view illustrating an emission spectrum of the light emitting device of Example 2.

FIG. 9 is a schematic sectional view illustrating the light emitting device of the ninth embodiment. A blue fluorescent layer 28 is provided such that the green fluorescent layer 22 is covered therewith.

According to the ninth embodiment, the high color rendering property can be realized similar to the first to eighth embodiments. Because the fluorescent resin application layer and the transparent resin layer are formed into the flat-plate shape, advantageously the light emitting device of the ninth embodiment is relatively easily produced.

While certain embodiments have been described, these embodiments have been presented by way of example only, and are not intended to limit the scope of the inventions. Indeed, the light emitting device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

For example, any binder resin that constitutes a base material of a sealing resin can be used as long as the binder resin transmits the light in a neighborhood of the peak wavelength of the light emitting element (excitation element) and a wavelength region longer than the neighborhood of the peak wavelength. Generally, examples of the binder resin include a silicone resin, an epoxy resin, a polydimethylcyclohexane derivative having an epoxy group, an oxetane resin, an acrylic resin, a cycloolefin resin, a urea resin, a fluorine resin, and a polyimide resin.

EXAMPLES

Example 1

The light emitting device of the fourth embodiment illustrated in FIG. 4 was produced. The blue LED that emits the blue light having the wavelength of 455 nm was used as the light emitting element. In the blue LED, an InGaN compound semiconductor was used as an active layer. At this point, the sialon green phosphor having the composition and peak wavelength illustrated in a field of Example 1 of TABLE 1 was applied. The CASN red phosphor illustrated in TABLE 3 was applied to the first red phosphor. The sialon red phosphor having the composition and peak wavelength illustrated in a field of Example 1 of TABLE 2 was applied. A mixture ratio of the first red phosphor, the second red phosphor, and the green phosphor was designed such that a color temperature became near the warm-white color (2800 K).

When the obtained light emitting device of Example 1 was driven at 20 mA, the color rendering property was evaluated with respect to the average color rendering index Ra and the special color rendering indexes R9 and R15 based on the evaluation method of JISZ8726. The luminous efficiency of the light emitting device was also evaluated. The luminous efficiency was evaluated using an integrating sphere. TABLE 4 illustrates the result. In the evaluation of the peak wavelength, the single phosphor was irradiated with the excitation light of the blue LED to measure the wavelength of the emitted light.

TABLE 1 illustrates values of x, y, z, u, and w in the equation (3) that is of the composition of the sialon green phosphor. TABLE 2 illustrates values of x2, a2, b2, c2, and d2 in the equation (2) that is of the composition of the sialon red phosphor. TABLE 3 illustrates values of x1, a1, b1, c1, and d1 in the equation (1) that is of the composition of the CASN red phosphor.

Example 2

The light emitting device was produced and evaluated similarly to Example 1 except that the sialon green phosphor illustrated in the field of Example 2 of TABLE 1 was applied to the green phosphor, the CASN red phosphor illustrated in the field of Example 2 of TABLE 3 was applied to the first red phosphor, and the sialon red phosphor illustrated in the field of Example 1 of TABLE 2 was applied to the second red phosphor. TABLE 4 illustrates the result.

Example 3

The light emitting device of the first embodiment illustrated in FIG. 1 was produced. The sialon green phosphor illustrated in the field of Example 3 of TABLE 1 was applied to the green phosphor, the CASN red phosphor illustrated in the field of Example 3 of TABLE 3 was applied to the first red phosphor, and the sialon red phosphor illustrated in the field of Example 3 of TABLE 2 was applied to the second red phosphor. The light emitting device was produced and evaluated similarly to Example 1 except above matter. TABLE 4 illustrates the result.

Example 4

The light emitting device of the second embodiment illustrated in FIG. 2 was produced. The sialon green phosphor illustrated in the field of Example 4 of TABLE 1 was applied to the green phosphor, the CASN red phosphor illustrated in the field of Example 4 of TABLE 3 was applied to the first red phosphor, and the sialon red phosphor illustrated in the field of Example 4 of TABLE 2 was applied to the second red phosphor. The light emitting device was produced and evaluated similarly to Example 1 except above matter. TABLE 4 illustrates the result.

Example 5

The light emitting device of the third embodiment illustrated in FIG. 3 was produced. The sialon green phosphor illustrated in the field of Example 5 of TABLE 1 was applied to the green phosphor, the CASN red phosphor illustrated in the field of Example 5 of TABLE 3 was applied to the first red phosphor, and the sialon red phosphor illustrated in the field of Example 5 of TABLE 2 was applied to the second red phosphor. The light emitting device was produced and evaluated similarly to Example 1 except above matter. TABLE 4 illustrates the result.

Example 6

The light emitting device of the third embodiment illustrated in FIG. 3 was produced. The LED chip 12 that emits the blue light having the peak wavelength of 455 nm was used as the light emitting element. In the LED chip 12, the InGaN compound semiconductor was used as the active layer. The LED chip 12 was bonded onto an 8-mm-square AlN package 10 by a solder, and the LED chip 12 was connected to an electrode through the gold wire 14. The transparent resin 18 is applied on the LED in the form of a dome shape, and the transparent resin 20 is applied onto the transparent resin 18 in the form of laminae. In a mixed red phosphor, the CASN red phosphor illustrated in the field of Example 6 of TABLE 3 as the first red phosphor and the sialon red phosphor illustrated in the field of Example 6 of TABLE 2 as the second red phosphor are mixed at a weight ratio 1:6.8. The 30-weight-percent mixed red phosphor is dispersed in the transparent resin 20. The transparent resin 30 is applied onto the transparent resin 20 in the form of the dome shape, and the transparent resin 22 is applied onto the transparent resin 30 in the form of laminae. The 30-weight-percent sialon green phosphor illustrated in the field of Example 6 of TABLE 1 as the green phosphor is dispersed in the transparent resin 22. The outermost transparent resin layer 24 is applied onto the transparent resin 22 in the form of laminae, thereby producing the light emitting device. The mixture ratio of the first red phosphor, the second red phosphor, and the green phosphor was designed such that the color temperature became near the white color (4200 K). The light emitting device was produced and evaluated similarly to Example 1. TABLE 4 illustrates the result.

Example 7

The light emitting device of the seventh embodiment illustrated in FIG. 7 was produced. The LED chip 12 that emits the blue light having the peak wavelength of 455 nm was used as the light emitting element. In the LED chip 12, the InGaN compound semiconductor was used as the active layer. The LED chip 12 was bonded onto the 8-mm-square AlN package 10 by a solder, and the LED chip 12 was connected to the electrode through the gold wire 14. The LED is sealed by the transparent resin 16 and the flat-plate-shape transparent resin 20a is applied onto the transparent resin 16 in the form of laminae. The 10-weight-percent CASN red phosphor illustrated in the field of Example 7 of TABLE 3 as the first red phosphor is dispersed in the transparent resin 20a. The transparent resin 20b is applied onto the transparent resin 20a in the form of the laminae. The 30-weight-percent sialon red phosphor illustrated in the field of Example 7 of TABLE 2 as the second red phosphor is dispersed in the transparent resin 20b. The transparent resin 20b is covered with the flat-plate-shape transparent resin 30, and the flat-plate-shape transparent resin 22 is applied onto the transparent resin 30. The 30-weight-percent sialon green phosphor illustrated in the field of Example 7 of TABLE 1 as the green phosphor is dispersed in the transparent resin 22. The outermost transparent resin layer 24 is applied onto the transparent resin 22 in the form of laminae, thereby producing the light emitting device. The mixture ratio of the first red phosphor, the second red phosphor, and the green phosphor was designed such that the color temperature became near the white color (4200 K). The light emitting device was produced and evaluated similarly to Example 1. TABLE 4 illustrates the result.

Example 8

The light emitting device of the seventh embodiment illustrated in FIG. 7 was produced. The LED chip 12 that emits the blue light having the peak wavelength of 455 nm was used as the light emitting element. In the LED chip 12, the InGaN compound semiconductor was used as the active layer. The LED chip 12 was bonded onto the 8-mm-square AlN package 10 by a solder, and the LED chip 12 was connected to the electrode through the gold wire 14. The LED is sealed by the resin 16 and the flat-plate-shape transparent resin 20a is applied onto the transparent resin 16 in the form of laminae. The 10-weight-percent CASN red phosphor illustrated in the field of Example 8 of TABLE 3 as the first red phosphor is dispersed in the transparent resin 20a. The transparent resin 20b is applied onto the transparent resin 20a in the form of the laminae. The 30-weight-percent sialon red phosphor illustrated in the field of Example 8 of TABLE 2 as the second red phosphor is dispersed in the transparent resin 20b. The transparent resin 20b is covered with the flat-plate-shape transparent resin 30, and the flat-plate-shape transparent resin 22 is applied onto the transparent resin 30 in the form of the laminae. The 30-weight-percent sialon green phosphor illustrated in the field of Example 8 of TABLE 1 as the green phosphor is dispersed in the transparent resin 22. The outermost transparent resin layer 24 is applied onto the transparent resin 22 in the form of laminae, thereby producing the light emitting device. A mixture ratio of the first red phosphor, the second red phosphor, and the green phosphor was designed such that a color temperature became near the warm-white color (2800 K). The light emitting device was produced and evaluated similarly to Example 1. TABLE 4 illustrates the result.

Example 9

The light emitting device of the fifth embodiment illustrated in FIG. 5 was produced. The LED chip 12 that emits the near-ultraviolet light having the peak wavelength of 405 nm was used as the light emitting element. In the LED chip 12, the InGaN compound semiconductor was used as the active layer. The LED chip 12 was bonded onto the 8-mm-square AlN package 10 by a solder, and the LED chip 12 was connected to the electrode through the gold wire 14. The transparent resin 18 is applied on the LED in the form of the dome shape, and the transparent resin 20 is applied onto the transparent resin 18 in the form of laminae. In a mixed red phosphor, the CASN red phosphor illustrated in the field of Example 9 of TABLE 3 as the first red phosphor and the sialon red phosphor illustrated in the field of Example 9 of TABLE 2 as the second red phosphor are mixed at a weight ratio 1:7.6. The 30-weight-percent mixed red phosphor is dispersed in the transparent resin 20. The transparent resin 30 is applied onto the transparent resin 20 in the form of the dome shape, and the transparent resin 22 is applied onto the transparent resin 30 in the form of laminae. The 30-weight-percent sialon green phosphor illustrated in the field of Example 9 of TABLE 1 as the green phosphor is dispersed in the transparent resin 22. The transparent resin layer 28 is applied onto the transparent resin 22 in the form of laminae, thereby producing the light emitting device. The 30-weight-percent halophosphate blue phosphor having a composition expressed by (Sr, Ca)$_{10}$(PO$_4$)$_6$Cl$_2$:Eu$^{2+}$ and the peak wavelength of 445 nm is dispersed in the transparent resin 28. The mixture ratio of the first red phosphor, the second red phosphor, and the green phosphor was designed such that the color temperature became near the white color (4200 K). The light emitting device was produced and evaluated similarly to Example 1. TABLE 4 illustrates the result.

Example 10

The light emitting device of the sixth embodiment illustrated in FIG. 6 was produced. The LED chip 12 that emits the near-ultraviolet light having the peak wavelength of 405 nm was used as the light emitting element. In the LED chip 12, the InGaN compound semiconductor was used as the active layer. The LED chip 12 was bonded onto the 8-mm-square AlN package 10 by a solder, and the LED chip 12 was connected to the electrode through the gold wire 14. The transparent resin 18 is applied on the LED in the form of the dome shape, and the transparent resin 20a is applied onto the transparent resin 18 in the form of laminae. The 10-weight-percent CASN red phosphor illustrated in the field of Example 10 of TABLE 3 as the first red phosphor is dispersed in the transparent resin 20a. The transparent resin 20b is applied onto the transparent resin 20a in the form of the laminae. The 30-weight-percent sialon red phosphor illustrated in the field of Example 10 of TABLE 2 as the second red phosphor is dispersed in the transparent resin 20b. The transparent resin 30 is applied onto the transparent resin 20b in the form of the dome shape, and the transparent resin 22 is applied onto the transparent resin 30 in the form of laminae. The 30-weight-percent sialon green phosphor illustrated in the field of Example 10 of TABLE 1 as the green phosphor is dispersed in the transparent resin 22. The transparent resin layer 28 is applied onto the transparent resin 22 in the form of laminae, thereby producing the light emitting device. The 30-weight-percent halophosphate blue phosphor having a composition expressed by $(Sr,Ca)_{10}(PO_4)_6Cl_2:Eu^{2+}$ is dispersed in the transparent resin 28. The mixture ratio of the first red phosphor, the second red phosphor, and the green phosphor was designed such that the color temperature became near the white color (4200 K). The light emitting device was produced and evaluated similarly to Example 1. TABLE 4 illustrates the result.

Example 11

The light emitting device of the fifth embodiment illustrated in FIG. 5 was produced. The LED chip 12 that emits the near-ultraviolet light having the peak wavelength of 405 nm was used as the light emitting element. In the LED chip 12, the InGaN compound semiconductor was used as the active layer. The LED chip 12 was bonded onto the 8-mm-square AlN package 10 by a solder, and the LED chip 12 was connected to the electrode through the gold wire 14. The transparent resin 18 is applied on the LED in the form of the dome shape, and the transparent resin 20 is applied onto the transparent resin 18 in the form of laminae. In a mixed red phosphor, the CASN red phosphor illustrated in the field of Example 11 of TABLE 3 as the first red phosphor and the sialon red phosphor illustrated in the field of Example 11 of TABLE 2 as the second red phosphor are mixed at a weight ratio 1:7.6. The 30-weight-percent mixed red phosphor is dispersed in the transparent resin 20. The transparent resin 30 is applied onto the transparent resin 20 in the form of the dome shape, and the transparent resin 22 is applied onto the transparent resin 30 in the form of laminae. The 30-weight-percent sialon green phosphor illustrated in the field of Example 11 of TABLE 1 as the green phosphor is dispersed in the transparent resin 22. The transparent resin layer 28 is applied onto the transparent resin 22 in the form of laminae, thereby producing the light emitting device. The 30-weight-percent halophosphate blue phosphor having a composition expressed by $(Sr,Ca)_{10}(PO_4)_6Cl_2:Eu^{2+}$ and the peak wavelength of 445 nm is dispersed in the transparent resin 28.

A mixture ratio of the first red phosphor, the second red phosphor, and the green phosphor was designed such that a color temperature became near the warm-white color (2800 K). The light emitting device was produced and evaluated similarly to Example 1. TABLE 4 illustrates the result.

Example 12

The light emitting device of the sixth embodiment illustrated in FIG. 6 was produced. The LED chip 12 that emits the near-ultraviolet light having the peak wavelength of 405 nm was used as the light emitting element. In the LED chip 12, the InGaN compound semiconductor was used as the active layer. The LED chip 12 was bonded onto the 8-mm-square AlN package 10 by a solder, and the LED chip 12 was connected to the electrode through the gold wire 14. The transparent resin 18 is applied on the LED in the form of the dome shape, and the transparent resin 20a is applied onto the transparent resin 18 in the form of laminae. The 10-weight-percent CASN red phosphor illustrated in the field of Example 12 of TABLE 3 as the first red phosphor is dispersed in the transparent resin 20a. The transparent resin 20b is applied onto the transparent resin 20a in the form of the laminae. The 30-weight-percent sialon red phosphor illustrated in the field of Example 12 of TABLE 2 as the second red phosphor is dispersed in the transparent resin 20b. The transparent resin 30 is applied onto the transparent resin 20b in the form of the dome shape, and the transparent resin 22 is applied onto the transparent resin 30 in the form of laminae. The 30-weight-percent sialon green phosphor illustrated in the field of Example 12 of TABLE 1 as the green phosphor is dispersed in the transparent resin 22. The transparent resin layer 28 is applied onto the transparent resin 22 in the form of laminae, thereby producing the light emitting device. The 30-weight-percent halophosphate blue phosphor having a composition expressed by $(Sr,Ca)_{10}(PO_4)_6Cl_2:Eu^{2+}$ is dispersed in the transparent resin 28. A mixture ratio of the first red phosphor, the second red phosphor, and the green phosphor was designed such that a color temperature became near the warm-white color (2800 K). The light emitting device was produced and evaluated similarly to Example 1. TABLE 4 illustrates the result.

Example 13

The light emitting device of the ninth embodiment illustrated in FIG. 9 was produced. The LED chip 12 that emits the near-ultraviolet light having the peak wavelength of 405 nm was used as the light emitting element. In the LED chip 12, the InGaN compound semiconductor was used as the active layer. The LED chip 12 was bonded onto the 8-mm-square AlN package 10 by a solder, and the LED chip 12 was connected to the electrode through the gold wire 14. The LED is sealed by the transparent resin 16 and the flat-plate-shape transparent resin 20a is applied onto the transparent resin 16 in the form of laminae. The 10-weight-percent CASN red phosphor illustrated in the field of Example 13 of TABLE 3 as the first red phosphor is dispersed in the transparent resin 20a. The transparent resin 20b is applied onto the transparent resin 20a in the form of the laminae. The 30-weight-percent sialon red phosphor illustrated in the field of Example 13 of TABLE 2 as the second red phosphor is dispersed in the transparent resin 20b. The transparent resin 20b is covered with the flat-plate-shape transparent resin 30, and the transparent resin 22 is applied onto the transparent resin 30 in the form of the laminae. The 30-weight-percent sialon green phosphor illustrated in the field of Example 13 of TABLE 1 as the green phosphor is dispersed in the transparent resin 22. The transparent resin layer 28 is applied onto the transparent resin 22 in the form of laminae, thereby producing the light emitting device. The 30-weight-percent halophosphate blue phosphor having a composition expressed by $(Sr,Ca)_{10}(PO_4)_6Cl_2:Eu^{2+}$ is dispersed in the transparent resin 28. The mixture ratio of the first red phosphor, the second red phosphor, and the green phosphor was designed such that the color temperature became near the warm-white color (2800 K). The light emitting device was produced and evaluated similarly to Example 1. TABLE 4 illustrates the result.

Example 14

The light emitting device of the eighth embodiment illustrated in FIG. 8 was produced. The LED chip 12 that emits the near-ultraviolet light having the peak wavelength of 405 nm was used as the light emitting element. In the LED chip 12, the InGaN compound semiconductor was used as the active layer. The LED chip 12 was bonded onto the 8-mm-square AlN package 10 by a solder, and the LED chip 12 was connected to the electrode through the gold wire 14. The LED is sealed by the transparent resin 16, and the flat-plate-shape transparent resin 20 is applied onto the transparent resin 16 in the form of laminae. In a mixed red phosphor, the CASN red phosphor illustrated in the field of Example 14 of TABLE 3 as the first red phosphor and the sialon red phosphor illustrated in the field of Example 14 of TABLE 2 as the second red phosphor are mixed at a weight ratio 1:4.9. The 30-weight-percent mixed red phosphor is dispersed in the transparent resin 20. The transparent resin 20 is covered with the flat-plate-shape transparent resin 30, and the transparent resin 22 is applied onto the transparent resin 30 in the form of the laminae. The 30-weight-percent sialon green phosphor illustrated in the field of Example 14 of TABLE 1 as the green phosphor is dispersed in the transparent resin 22. The transparent resin layer 28 is applied onto the transparent resin 22 in the form of laminae, thereby producing the light emitting device. The 30-weight-percent halophosphate blue phosphor having a composition expressed by $(Sr,Ca)_{10}(PO_4)_6Cl_2:Eu^{2+}$ is dispersed in the transparent resin 28. The mixture ratio of the first red phosphor, the second red phosphor, and the green phosphor was designed such that the color temperature became near the warm-white color (2800 K). The light emitting device was produced and evaluated similarly to Example 1. TABLE 4 illustrates the result.

Example 15

The light emitting device of the ninth embodiment illustrated in FIG. 9 was produced. The LED chip 12 that emits the near-ultraviolet light having the peak wavelength of 405 nm was used as the light emitting element. In the LED chip 12, the InGaN compound semiconductor was used as the active layer. The LED chip 12 was bonded onto the 8-mm-square AlN package 10 by a solder, and the LED chip 12 was connected to the electrode through the gold wire 14. The LED is sealed by the transparent resin 16 and the flat-plate-shape transparent resin 20a is applied onto the transparent resin 16 in the form of laminae. The 10-weight-percent CASN red phosphor illustrated in the field of Example 15 of TABLE 3 as the first red phosphor is dispersed in the transparent resin 20a. The flat-plate-shape transparent resin 20b is applied onto the transparent resin 20a in the form of the laminae. The 30-weight-percent sialon red phosphor illustrated in the field of Example 15 of TABLE 2 as the second red phosphor is dispersed in the transparent resin 20b. The transparent resin 20b is covered with the flat-plate-shape transparent resin 30, and the transparent resin 22 is applied onto the transparent resin 30 in the form of the laminae. The 30-weight-percent sialon green phosphor illustrated in the field of Example 15 of TABLE 1 as the green phosphor is dispersed in the transparent resin 22. The transparent resin layer 28 is applied onto the transparent resin 22 in the form of laminae, thereby producing the light emitting device. The 30-weight-percent halophosphate blue phosphor having a composition expressed by $(Sr,Ca)_{10}(PO_4)_6Cl_2:Eu^{2+}$ is dispersed in the transparent resin 28. The mixture ratio of the first red phosphor, the second red phosphor, and the green phosphor was designed such that the color temperature became near the white color (4200 K). The light emitting device was produced and evaluated similarly to Example 1. TABLE 4 illustrates the result.

Example 16

The light emitting device of the eighth embodiment illustrated in FIG. 8 was produced. The LED chip 12 that emits the near-ultraviolet light having the peak wavelength of 405 nm was used as the light emitting element. In the LED chip 12, the InGaN compound semiconductor was used as the active layer. The LED chip 12 was bonded onto the 8-mm-square AlN package 10 by a solder, and the LED chip 12 was connected to the electrode through the gold wire 14. The LED is sealed by the transparent resin 16, and the flat-plate-shape transparent resin 20 is applied onto the transparent resin 16 in the form of laminae. In a mixed red phosphor, the CASN red phosphor illustrated in the field of Example 16 of TABLE 3 as the first red phosphor and the sialon red phosphor illustrated in the field of Example 16 of TABLE 2 as the second red phosphor are mixed at a weight ratio 1:4.9. The 30-weight-percent mixed red phosphor is dispersed in the transparent resin 20. The transparent resin 20 is covered with the flat-plate-shape transparent resin 30, and the transparent resin 22 is applied onto the transparent resin 30 in the form of the laminae. The 30-weight-percent sialon green phosphor illustrated in the field of Example 16 of TABLE 1 as the green phosphor is dispersed in the transparent resin 22. The transparent resin layer 28 is applied onto the transparent resin 22 in the form of laminae, thereby producing the light emitting device. The 30-weight-percent halophosphate blue phosphor having a composition expressed by $(Sr,Ca)_{10}(PO_4)_6Cl_2:Eu^{2+}$ is dispersed in the transparent resin 28. The mixture ratio of the first red phosphor, the second red phosphor, and the green phosphor was designed such that the color temperature became near the white color (4200 K). The light emitting device was produced and evaluated similarly to Example 1. TABLE 4 illustrates the result.

Examples 17 to 20

The light emitting devices were produced and evaluated similarly to Example 1 except that the sialon green phosphor illustrated in the field of Examples 17 to 20 of TABLE 5 were applied to the green phosphor, the CASN red phosphor illustrated in the field of Example 10 of TABLE 3 was applied to the first red phosphor, and the sialon red phosphor illustrated in the field of Examples 17 to 20 of TABLE 6 were applied to the second red phosphor. TABLE 7 illustrates the result.

Examples 21 to 24

The light emitting devices of the third embodiment illustrated in FIG. 3 were produced. The LED chip 12 that emits the blue light having the peak wavelength of 455 nm was used as the light emitting element. In the LED chip 12, the InGaN compound semiconductor was used as the active layer. The LED chip 12 was bonded onto an 8-mm-square AlN package 10 by a solder, and the LED chip 12 was connected to an electrode through the gold wire 14. The transparent resin 18 is applied on the LED in the form of a dome shape, and the transparent resin 20 is applied onto the transparent resin 18 in the form of laminae. In a mixed red phosphor, the CASN red phosphor illustrated in the field of Example 6 of TABLE 3 as the first red phosphor and the sialon red phosphor illustrated in the field of Examples 21 to 24 of TABLE 6 as the second red phosphor are mixed at a weight ratio 1:6.8. The 30-weight-percent mixed red phosphor is dispersed in the transparent resin 20. The transparent resin 30 is applied onto the transparent resin 20 in the form of the dome shape, and the transparent resin 22 is applied onto the transparent resin 30 in the form of laminae. The 30-weight-percent sialon green phosphor illustrated in the field of Example 6 of TABLE 1 as the green phosphor is dispersed in the transparent resin 22. The outermost transparent resin layer 24 is applied onto the transparent resin 22 in the form of laminae, thereby producing the light emitting device. The mixture ratio of the first red phosphor, the second red phosphor, and the green phosphor was designed such that the color temperature became near the white color (4200 K). The light emitting device was produced and evaluated similarly to Example 1. TABLE 7 illustrates the result.

Comparative Example 1

The light emitting device similar to that of the third embodiment illustrated in FIG. 3 was produced. The silicate green phosphor illustrated in the field of Comparative example 1 of TABLE 1 was applied to the green phosphor, and the silicate red phosphor illustrated in the field of Comparative example 1 of TABLE 2 was applied to the red phosphor. The light emitting device was produced and evaluated similarly to Example 5 except above matter. TABLE 4 illustrates the result.

Comparative Example 2

The light emitting device similar to that of the first embodiment illustrated in FIG. 1 was produced. The silicate green phosphor illustrated in the field of Comparative example 2 of TABLE 1 was applied to the green phosphor, and the silicate red phosphor illustrated in the field of Comparative example 2 of TABLE 2 was applied to the red phosphor. The light emitting device was produced and evaluated similarly to Example 3 except above matter. TABLE 4 illustrates the result.

Comparative Example 3

The light emitting device similar to that of the third embodiment illustrated in FIG. 3 was produced. The sialon green phosphor illustrated in the field of Comparative example 3 of TABLE 1 was applied to the green phosphor, and the sialon red phosphor illustrated in the field of Comparative example 3 of TABLE 3 was applied to the red phosphor. The light emitting device was produced and evaluated similarly to Example 5 except above matter. TABLE 4 illustrates the result.

Comparative Example 4

The sialon green phosphor illustrated in the field of Comparative example 4 of TABLE 1 was applied to the green phosphor, and the sialon red phosphor illustrated in the field of Comparative example 4 of TABLE 3 was applied to the red phosphor. The green phosphor has the composition out of the equation (3), and the red phosphor has the composition out of the equation (2). Both the green phosphor and the red phosphor have the low luminous efficiency that is not enough to produce the light emitting device.

Comparative Example 5

The sialon green phosphor illustrated in the field of Comparative example 5 of TABLE 1 was applied to the green phosphor, and the sialon red phosphor illustrated in the field of Comparative example 5 of TABLE 3 was applied to the red phosphor. The green phosphor has the composition out of the equation (3), and the red phosphor has the composition out of the equation (2). Both the green phosphor and the red phosphor have the low luminous efficiency that is not enough to produce the light emitting device.

Comparative Example 6

The silicate green phosphor illustrated in the field of Comparative example 6 of TABLE 1 was applied to the green phosphor, and the nitride red phosphor illustrated in the field of Comparative example 5 of TABLE 3 was applied to the red phosphor. Both the green phosphor and the red phosphor have the low luminous efficiency that is not enough to produce the light emitting device.

Comparative Example 7

The light emitting device similar to that of the third embodiment illustrated in FIG. 3 was produced. The LED chip 12 that emits the blue light having the peak wavelength of 455 nm was used as the light emitting element. In the LED chip 12, the InGaN compound semiconductor was used as the active layer. The LED chip 12 was bonded onto an 8-mm-square AlN package 10 by a solder, and the LED chip 12 was connected to an electrode through the gold wire 14. The transparent resin 18 is applied on the LED in the form of the dome shape, and the transparent resin 22 is applied onto the transparent resin 18 in the form of laminae. The 30-weight-percent sialon red phosphor illustrated in the field of Comparative example 7 of TABLE 2 as the red phosphor is dispersed in the transparent resin 22. The transparent resin 30 is applied onto the transparent resin 22 in the form of the dome shape, and the transparent resin 24 is applied onto the transparent resin 30 in the form of laminae. The 30-weight-percent sialon green phosphor illustrated in the field of Comparative example 7 of TABLE 1 as the green phosphor is dispersed in the transparent resin 24, thereby producing the light emitting device. The design was made such that the color temperature became near the white color (4200 K). The light emitting device was produced and evaluated similarly to Example 1. TABLE 4 illustrates the result.

Comparative Example 8

The light emitting device similar to that of the third embodiment illustrated in FIG. 3 was produced. The LED chip 12 that emits the blue light having the peak wavelength of 455 nm was used as the light emitting element. In the LED chip 12, the InGaN compound semiconductor was used as the active layer. The LED chip 12 was bonded onto an 8-mm-square AlN package 10 by a solder, and the LED chip 12 was connected to an electrode through the gold wire 14. The transparent resin 18 is applied on the LED in the form of the dome shape, and the transparent resin 20 is applied onto the transparent resin 18 in the form of laminae. The 30-weight-percent sialon red phosphor illustrated in the field of Comparative example 8 of TABLE 2 as the red phosphor is dispersed in the transparent resin 20. The transparent resin 30 is applied onto the transparent resin 20 in the form of the dome shape, and the transparent resin 22 is applied onto the transparent resin 30 in the form of laminae. The 30-weight-percent sialon green phosphor illustrated in the field of Comparative example 8 of TABLE 1 as the green phosphor is dispersed in the transparent resin 22. The outermost transparent resin layer 24 is applied onto the transparent resin 22 in the form of laminae, thereby producing the light emitting device. The design was made such that the color temperature became near the warm-white color (2800 K). The light emitting device was produced and evaluated similarly to Example 1. TABLE 4 illustrates the result.

Comparative Example 9

The light emitting device similar to that of the fifth embodiment illustrated in FIG. 5 was produced. The LED chip 12 that emits the near-ultraviolet light having the peak wavelength of 405 nm was used as the light emitting element. In the LED chip 12, the InGaN compound semiconductor was used as the active layer. The LED chip 12 was bonded onto the 8-mm-square AlN package 10 by a solder, and the LED chip 12 was connected to the electrode through the gold wire 14. The transparent resin 18 is applied on the LED in the form of the dome shape, and the transparent resin 20 is applied onto the transparent resin 18 in the form of laminae. The 30-weight-percent sialon red phosphor illustrated in the field of Comparative example 9 of TABLE 2 as the red phosphor is dispersed in the transparent resin 20. The transparent resin 30 is applied onto the transparent resin 20 in the form of the dome shape, and the transparent resin 22 is applied onto the transparent resin 30 in the form of laminae. The 30-weight-percent sialon green phosphor illustrated in the field of Comparative example 9 of TABLE 1 as the green phosphor is dispersed in the transparent resin 22. The transparent resin layer 28 is applied onto the transparent resin 22 in the form of laminae, thereby producing the light emitting device. The 30-weight-percent halophosphate blue phosphor having a composition expressed by $(Sr,Ca)_{10}(PO_4)_6Cl_2:Eu^{2+}$ is dispersed in the transparent resin 28. The design was made such that the color temperature became near the white color (4200 K). The light emitting device was produced and evaluated similarly to Example 1. TABLE 4 illustrates the result.

Comparative Example 10

The light emitting device similar to that of the fifth embodiment illustrated in FIG. 5 was produced. The LED chip 12 that emits the near-ultraviolet light having the peak wavelength of 405 nm was used as the light emitting element. In the LED chip 12, the InGaN compound semiconductor was used as the active layer. The LED chip 12 was bonded onto the 8-mm-square AlN package 10 by a solder, and the LED chip 12 was connected to the electrode through the gold wire 14. The transparent resin 18 is applied on the LED in the form of the dome shape, and the transparent resin 20 is applied onto the transparent resin 18 in the form of laminae. The 30-weight-percent sialon red phosphor illustrated in the field of Comparative example 10 of TABLE 2 as the red phosphor is dispersed in the transparent resin 20. The transparent resin 30 is applied onto the transparent resin 20 in the form of the dome shape, and the transparent resin 22 is applied onto the transparent resin 30 in the form of laminae. The 30-weight-percent sialon green phosphor illustrated in the field of Comparative example 10 of TABLE 1 as the green phosphor is dispersed in the transparent resin 22. The transparent resin layer 28 is applied onto the transparent resin 22 in the form of laminae, thereby producing the light emitting device. The 30-weight-percent halophosphate blue phosphor having a composition expressed by $(Sr,Ca)_{10}(PO_4)_6Cl_2:Eu^{2+}$ is dispersed in the transparent resin 28. The design was made such that the color temperature became near the warm-white color (2800 K). The light emitting device was produced and evaluated similarly to Example 1. TABLE 4 illustrates the result.

In the light emitting devices of Examples 1 to 16, the high average color rendering index Ra and special color rendering index R9 and R15 were obtained compared with the light emitting devices of Comparative examples 1 to 9. In Examples 1 to 16, the light emitting device having the structure in which the application structure suppresses the re-absorption between the phosphors had the luminous efficiency (luminous flux efficiency) higher than that of the light emitting device having no structure which the application structure suppresses the re-absorption between the phosphors.

TABLE 1

| | x | y | z | u | w | Peak Wavelength (nm) |
|---|---|---|---|---|---|---|
| Example 1 | 0.10 | −0.0796 | 0.1068 | −0.0427 | 1.4272 | 524 |
| Example 2 | 0.08 | −0.0625 | 0.1250 | 0.2188 | 0.0625 | 518 |
| Example 3 | 0.1 | −0.0818 | 0.0303 | −0.0606 | 0.0909 | 520 |
| Example 4 | 0.07 | −0.0657 | −0.2318 | −0.0346 | 0.7924 | 511 |
| Example 5 | 0.08 | −0.0624 | −0.1480 | 0.1105 | −0.1052 | 516 |
| Example 6 | 0.08 | 0.0019 | 0.0019 | 0.0113 | −0.0131 | 520 |
| Example 7 | 0.08 | 0.0019 | 0.0019 | 0.0113 | −0.0131 | 520 |
| Example 8 | 0.08 | 0.0019 | 0.0019 | 0.0113 | −0.0131 | 520 |
| Example 9 | 0.08 | 0.0019 | 0.0019 | 0.0113 | −0.0131 | 520 |
| Example 10 | 0.08 | 0.0019 | 0.0019 | 0.0113 | −0.0131 | 520 |
| Example 11 | 0.08 | 0.0019 | 0.0019 | 0.0113 | −0.0131 | 520 |
| Example 12 | 0.08 | 0.0019 | 0.0019 | 0.0113 | −0.0131 | 520 |
| Example 13 | 0.08 | 0.0019 | 0.0019 | 0.0113 | −0.0131 | 520 |
| Example 14 | 0.08 | 0.0019 | 0.0019 | 0.0113 | −0.0131 | 520 |
| Example 15 | 0.08 | 0.0019 | 0.0019 | 0.0113 | −0.0131 | 520 |
| Example 16 | 0.08 | 0.0019 | 0.0019 | 0.0113 | −0.0131 | 520 |
| Comparative example 1 | | Silicate $(Ba_{0.2}Sr_{0.8})_2SiO_4:Eu^{2+}$ | | | | 525 |
| Comparative example 2 | | Silicate $(Ba_{0.2}Sr_{0.8})_2SiO_4:Eu^{2+}$ | | | | 524 |
| Comparative example 3 | 0.1 | −0.0818 | 0.0303 | −0.0606 | 0.0909 | 520 |
| Comparative example 4 | 0.080 | 0.0306 | 1.46 | 2.99 | 4.15 | — |
| Comparative example 5 | 0.080 | −0.10 | 0.048 | 3.12 | 3.96 | — |
| Comparative example 6 | 0.10 | −0.37 | −0.35 | 2.64 | 3.81 | — |
| Comparative example 7 | 0.08 | 0.0019 | 0.0019 | 0.0113 | −0.0131 | 520 |
| Comparative example 8 | 0.08 | 0.0019 | 0.0019 | 0.0113 | −0.0131 | 520 |
| Comparative example 9 | 0.08 | 0.0019 | 0.0019 | 0.0113 | −0.0131 | 520 |

TABLE 2

| | X2 | a2 | b2 | c2 | d2 | Peak Wavelength (nm) |
|---|---|---|---|---|---|---|
| Example 1 | 0.05 | 0.730 | 2.60 | 0.270 | 4.80 | 604 |
| Example 2 | 0.05 | 0.680 | 2.54 | 0.332 | 4.29 | 595 |
| Example 3 | 0.06 | 0.680 | 2.54 | 0.332 | 4.29 | 610 |
| Example 4 | 0.08 | 0.680 | 2.54 | 0.332 | 4.29 | 616 |
| Example 5 | 0.09 | 0.680 | 2.54 | 0.332 | 4.29 | 616 |
| Example 6 | 0.05 | 0.67 | 2.33 | 0.33 | 4.33 | 598 |
| Example 7 | 0.05 | 0.67 | 2.33 | 0.33 | 4.33 | 598 |
| Example 8 | 0.05 | 0.67 | 2.33 | 0.33 | 4.33 | 598 |
| Example 9 | 0.05 | 0.67 | 2.33 | 0.33 | 4.33 | 598 |
| Example 10 | 0.05 | 0.67 | 2.33 | 0.33 | 4.33 | 598 |
| Example 11 | 0.05 | 0.67 | 2.33 | 0.33 | 4.33 | 598 |

TABLE 2-continued

| | X2 | a2 | b2 | c2 | d2 | Peak Wavelength (nm) |
|---|---|---|---|---|---|---|
| Example 12 | 0.05 | 0.724 | 2.44 | 0.31 | 4.52 | 600 |
| Example 13 | 0.05 | 0.724 | 2.44 | 0.31 | 4.52 | 600 |
| Example 14 | 0.05 | 0.724 | 2.44 | 0.31 | 4.52 | 600 |
| Example 15 | 0.05 | 0.724 | 2.44 | 0.31 | 4.52 | 600 |
| Example 16 | 0.05 | 0.724 | 2.44 | 0.31 | 4.52 | 600 |
| Comparative example 1 | Silicate $(Ba_{0.2}Sr_{0.8})_2SiO_4:Eu^{2+}$ | | | | | 585 |
| Comparative example 2 | Silicate $(Ba_{0.2}Sr_{0.8})_2SiO_4:Eu^{2+}$ | | | | | 585 |
| Comparative example 3 | Not Available | | | | | — |
| Comparative example 4 | 0.50 | 0.350 | 4.61 | 0.613 | 2.23 | — |
| Comparative example 5 | 0.14 | 1.12 | 1.35 | 0.580 | 6.34 | — |
| Comparative example 6 | 0.10 | 0.450 | 5.00 | 0.00 | 8.00 | — |
| Comparative example 7 | 0.20 | 0.667 | 2.33 | 0.333 | 4.33 | 625 |
| Comparative example 8 | 0.20 | 0.667 | 2.33 | 0.333 | 4.33 | 625 |
| Comparative example 9 | 0.20 | 0.667 | 2.33 | 0.333 | 4.33 | 625 |

TABLE 3

| | X1 | a1 | b1 | c1 | d1 | Peak Wavelength (nm) |
|---|---|---|---|---|---|---|
| Example 1 | 0.018 | 0.915 | 1.01 | 0.40 | 2.71 | 655 |
| Example 2 | 0.018 | 0.915 | 1.01 | 0.40 | 2.71 | 655 |
| Example 3 | 0.018 | 0.915 | 1.01 | 0.40 | 2.71 | 655 |
| Example 4 | 0.014 | 0.927 | 1.02 | 0.25 | 2.72 | 644 |
| Example 5 | 0.014 | 0.927 | 1.02 | 0.25 | 2.72 | 644 |
| Example 6 | 0.019 | 0.996 | 1.02 | 0.26 | 2.71 | 652 |
| Example 7 | 0.019 | 0.996 | 1.02 | 0.26 | 2.71 | 652 |
| Example 8 | 0.019 | 0.996 | 1.02 | 0.26 | 2.71 | 652 |
| Example 9 | 0.019 | 0.996 | 1.02 | 0.26 | 2.71 | 652 |
| Example 10 | 0.019 | 0.996 | 1.02 | 0.26 | 2.71 | 652 |
| Example 11 | 0.019 | 0.996 | 1.02 | 0.26 | 2.71 | 652 |
| Example 12 | 0.019 | 0.996 | 1.02 | 0.26 | 2.71 | 652 |
| Example 13 | 0.019 | 0.996 | 1.02 | 0.26 | 2.71 | 652 |
| Example 14 | 0.019 | 0.996 | 1.02 | 0.26 | 2.71 | 652 |
| Example 15 | 0.019 | 0.996 | 1.02 | 0.26 | 2.71 | 652 |
| Example 16 | 0.019 | 0.996 | 1.02 | 0.26 | 2.71 | 652 |
| Comparative example 1 | Not Available | | | | | — |
| Comparative example 2 | Not Available | | | | | — |
| Comparative example 3 | 0.019 | 0.996 | 1.02 | 0.26 | 2.71 | 652 |
| Comparative example 4 | Not Available | | | | | — |
| Comparative example 5 | Not Available | | | | | — |
| Comparative example 6 | Not Available | | | | | — |
| Comparative example 7 | Not Available | | | | | — |
| Comparative example 8 | Not Available | | | | | — |
| Comparative example 9 | Not Available | | | | | — |

TABLE 4

| | Color Temperature (K) | Ra | R9 | R15 | Luminous flux efficiency (lm/W) |
|---|---|---|---|---|---|
| Example 1 | 2693 | 98 | 88 | 95 | 43 |
| Example 2 | 2620 | 98 | 86 | 97 | 43 |
| Example 3 | 2730 | 98 | 88 | 95 | 43 |
| Example 4 | 2880 | 98 | 83 | 97 | 44 |
| Example 5 | 2710 | 98 | 88 | 95 | 43 |
| Example 6 | 4200 | 97 | 98 | 96 | 46 |
| Example 7 | 4200 | 97 | 98 | 96 | 47 |
| Example 8 | 2800 | 98 | 99 | 95 | 30 |
| Example 9 | 4200 | 98 | 99 | 95 | 32 |
| Example 10 | 4200 | 98 | 91 | 98 | 29 |
| Example 11 | 2800 | 98 | 91 | 98 | 31 |
| Example 12 | 2800 | 98 | 91 | 98 | 31 |
| Example 13 | 2800 | 98 | 91 | 98 | 29 |
| Example 14 | 2800 | 98 | 91 | 98 | 31 |
| Example 15 | 4200 | 98 | 95 | 99 | 30 |
| Example 16 | 4200 | 98 | 95 | 99 | 32 |
| Comparative example 1 | 2800 | 52 | −122 | 28 | 80 |
| Comparative example 2 | 2700 | 49 | −126 | 26 | 78 |
| Comparative example 3 | 2653 | 68 | −4 | 62 | 40 |
| Comparative example 7 | 4200 | 93 | 83 | 90 | 55 |
| Comparative example 8 | 2800 | 94 | 90 | 98 | 47 |
| Comparative example 9 | 4200 | 92 | 82 | 91 | 36 |
| Comparative example 10 | 2800 | 94 | 91 | 97 | 39 |

TABLE 5

| | x | y | z | u | w | Peak Wavelength (nm) |
|---|---|---|---|---|---|---|
| Example 17 | 0.018 | −0.09 | −0.96 | −0.55 | 0.62 | 519 |
| Example 18 | 0.018 | −0.12 | −1.24 | −0.71 | −0.63 | 519 |
| Example 19 | 0.018 | −0.12 | −1.24 | −0.71 | −0.63 | 521 |
| Example 20 | 0.025 | −0.10 | −1.21 | −0.71 | −0.74 | 521 |
| Example 21 | 0.016 | −0.14 | −1.46 | −0.92 | −0.47 | 519 |
| Example 22 | 0.018 | −0.12 | −1.24 | −0.71 | −0.63 | 519 |
| Example 23 | 0.025 | −0.10 | −1.21 | −0.71 | −0.74 | 521 |
| Example 24 | 0.025 | −0.10 | −1.21 | −0.71 | −0.74 | 521 |

TABLE 6

| | X2 | a2 | b2 | c2 | d2 | Peak Wavelength (nm) |
|---|---|---|---|---|---|---|
| Example 17 | 0.038 | 0.68 | 2.60 | 0.19 | 4.86 | 630 |
| Example 18 | 0.037 | 0.68 | 2.64 | 0.16 | 4.86 | 634 |
| Example 19 | 0.036 | 0.59 | 2.32 | 0.16 | 4.41 | 632 |
| Example 20 | 0.038 | 0.68 | 2.60 | 0.19 | 4.86 | 630 |
| Example 21 | 0.038 | 0.68 | 2.60 | 0.19 | 4.86 | 630 |
| Example 22 | 0.037 | 0.68 | 2.64 | 0.16 | 4.86 | 634 |
| Example 23 | 0.036 | 0.59 | 2.32 | 0.16 | 4.41 | 632 |
| Example 24 | 0.038 | 0.68 | 2.60 | 0.19 | 4.86 | 630 |

TABLE 7

| | Color Temperature (K) | Ra | R9 | R15 | Luminous flux efficiency (lm/W) |
|---|---|---|---|---|---|
| Example 17 | 2800 | 96 | 85 | 97 | 26 |
| Example 18 | 2800 | 95 | 87 | 92 | 24 |
| Example 19 | 2800 | 96 | 85 | 97 | 26 |
| Example 20 | 2800 | 96 | 85 | 97 | 26 |
| Example 21 | 4200 | 95 | 87 | 92 | 33 |
| Example 22 | 4200 | 95 | 72 | 88 | 32 |
| Example 23 | 4200 | 95 | 87 | 92 | 33 |
| Example 24 | 4200 | 95 | 87 | 92 | 33 |

What is claimed is:

1. A light emitting device comprising:
a light emitting element emitting light having a wavelength of 380 nm to 470 nm;
a first red phosphor disposed on the light emitting element, the first red phosphor having a composition expressed by equation (1);
a second red phosphor disposed on the light emitting element, the second red phosphor having a composition expressed by equation (2); and
a green phosphor disposed on the light emitting element, the green phosphor having a composition expressed by equation (3), $$(Ca_{1-x1}Eu_{x1})_{a1}AlSi_{b1}O_{c1}N_{d1}:Eu \qquad (1)$$

(In the equation (1), x1, a1, b1, c1 and d1 satisfy the following relationship: $0<x1<0.03$, $0.90<a1<1.1$, $0.90<b1<1.1$, $0.20<c1<0.45$, $2.40<d1\leq3.00$)

$$(Sr_{1-x2}Eu_{x2})_{a2}Si_{b2}AlO_{c2}N_{d2} \qquad (2)$$

(In the equation (2), x2, a2, b2, c2, and d2 satisfy the following relationship: $0<x2<1$, $0.55<a2<0.95$, $2.0<b2<3.9$, $0<c2<0.6$, $4<d2<5.7$)

$$(Sr_{1-x}Eu_x)_{3-y}Si_{13-z}Al_{3+z}O_{2+u}N_{21-w} \qquad (3)$$

(In the equation (3), x, y, z, u, and w satisfy the following relationship: $0<x<1$, $-0.1<y<0.3$, $-3<z\leq1$, $-3<u-w\leq1.5$, where $-2\leq u$ and $w\leq21$ so that in equation (3), O and N are not below zero in amount).

2. The device according to claim 1, wherein the light emitting element emits light having a wavelength of 440 nm to 470 nm.

3. The device according to claim 1, wherein x2, a2, b2, c2, and d2 satisfy a relationship of $0.01<x2\leq0.10$, $0.58\leq a2\leq0.70$, $2.1\leq b2\leq3.5$, $0.1\leq c2\leq0.5$, $4.1\leq d2\leq5.0$ in the equation (2).

4. The device according to claim 2, wherein x2, a2, b2, c2, and d2 satisfy the relationship of $0.01<x2\leq0.10$, $0.58\leq a2\leq0.70$, $2.1\leq b2\leq3.5$, $0.1\leq c2\leq0.5$, $4.1\leq d2\leq5.0$ in the equation (2).

5. The device according to claim 1, further comprising a blue phosphor disposed on the light emitting element.

6. The device according to claim 5, wherein the light emitting element emits light having a wavelength of 380 nm to 420 nm.

7. A device comprising:
a board;
a light emitting element mounted on the board;
a red fluorescent layer formed on the light emitting element, the red fluorescent layer including a first red phosphor having a composition expressed by equation (1) and a second red phosphor having a composition expressed by equation (2), the first red phosphor and the second red phosphor being dispersed in a resin; and
a green fluorescent layer formed on the red fluorescent layer, the green fluorescent layer including a green phosphor dispersed in a resin, the green phosphor having a composition expressed by equation (3), $$(Ca_{1-x1}Eu_{x1})_{a1}AlSi_{b1}O_{c1}N_{d1}:Eu \qquad (1)$$

(In the equation (1), x1, a1, b1, c1 and d1 satisfy the following relationship: $0<x1<0.03$, $0.90<a1<1.1$, $0.90<b1<1.1$, $0.20<c1<0.45$, $2.40<d1\leq3.00$)

$$(Sr_{1-x2}Eu_{x2})_{a2}Si_{b2}AlO_{c2}N_{d2} \qquad (2)$$

(In the equation (2), x2, a2, b2, c2, and d2 satisfy the following relationship: $0<x2<1$, $0.55<a2<0.95$, $2.0<b2<3.9$, $0<c2<0.6$, $4<d2<5.7$)

$$(Sr_{1-x}Eu_x)_{3-y}Si_{13-z}Al_{3+z}O_{2+u}N_{21-w} \qquad (3)$$

(In the equation (3), x, y, z, u, and w satisfy the following relationship: $0<x<1$, $-0.1<y<0.3$, $-3<z\leq1$, $-3<u-w\leq1.5$, where $-2\leq u$ and $w\leq21$ so that in equation (3), O and N are not below zero in amount).

8. The device according to claim 7, wherein the light emitting element emits light having a wavelength of 440 nm to 470 nm.

9. The device according to claim 7, wherein x2, a2, b2, c2, and d2 satisfy a relationship of $0.01<x2\leq0.10$, $0.58\leq a2\leq0.70$, $2.1\leq b2\leq3.5$, $0.1\leq c2\leq0.5$, $4.1\leq d2\leq5.0$ in the equation (2).

10. The device according to claim 8, wherein x2, a2, b2, c2, and d2 satisfy a relationship of $0.01<x2\leq0.10$, $0.58\leq a2\leq0.70$, $2.1\leq b2\leq3.5$, $0.1\leq c2\leq0.5$, $4.1\leq d2\leq5.0$ in the equation (2).

11. The device according to claim 7, further comprising a blue fluorescent layer formed on the green fluorescent layer, the blue fluorescent layer including a blue phosphor dispersed in a resin.

12. The device according to claim 11, wherein the light emitting element emits light having a wavelength of 380 nm to 420 nm.

13. The device according to claim 7, further comprising a transparent resin layer formed between the red fluorescent layer and the green fluorescent layer.

14. A light emitting device comprising:
a board;
a light emitting element mounted on the board;
a first red fluorescent layer formed on the light emitting element, the first red fluorescent layer including a first red phosphor dispersed in a resin, the first red phosphor having a composition expressed by equation (1);
a second red fluorescent layer formed on the first red fluorescent layer, the second red fluorescent layer including a second red phosphor dispersed in a resin, the second red phosphor having a composition expressed by equation (2); and
a green fluorescent layer formed on the second red fluorescent layer, the green fluorescent layer including a green phosphor dispersed in a resin, the green phosphor having a composition expressed by equation (3), $$(Ca_{1-x1}Eu_{x1})_{a1}AlSi_{b1}O_{c1}N_{d1}:Eu \qquad (1)$$

(In the equation (1), x1, a1, b1, c1 and d1 satisfy the following relationship: $0<x1<0.03$, $0.90<a1<1.1$, $0.90<b1<1.1$, $0.20<c1<0.45$, $2.40<d1\leq3.00$)

$$(Sr_{1-x2}Eu_{x2})_{a2}Si_{b2}AlO_{c2}N_{d2} \qquad (2)$$

(In the equation (2), x2, a2, b2, c2, and d2 satisfy the following relationship: $0<x2<1$, $0.55<a2<0.95$, $2.0<b2<3.9$, $0<c2<0.6$, $4<d2<5.7$)

$$(Sr_{1-x}Eu_x)_{3-y}Si_{13-z}Al_{3+z}O_{2+u}N_{21-w} \qquad (3)$$

(In the equation (3), x, y, z, u, and w satisfy the following relationship: $0<x<1$, $-0.1<y<0.3$, $-3<z\leq1$, $-3<u-w\leq1.5$, where $-2\leq u$ and $w\leq21$ so that in equation (3), O and N are not below zero in amount).

15. The device according to claim 14, wherein the light emitting element emits light having a wavelength of 440 nm to 470 nm.

16. The device according to claim 14, wherein x2, a2, b2, c2, and d2 satisfy a relationship of $0.01<x2\leq0.10$, $0.58\leq a2\leq0.70$, $2.1\leq b2\leq3.5$, $0.1\leq c2\leq0.5$, $4.1\leq d\leq5.0$ in the equation (2).

17. The device according to claim 15, wherein x2, a2, b2, c2, and d2 satisfy a relationship of $0.01 < x2 \leqq 0.10$, $0.58 \leqq a2 \leqq 0.70$, $2.1 \leqq b2 \leqq 3.5$, $0.1 \leqq c2 \leqq 0.5$, $4.1 \leqq d2 \leqq 5.0$ in the equation (2).

18. The device according to claim 14, further comprising a blue fluorescent layer formed on the green fluorescent layer, the blue fluorescent layer including a blue phosphor dispersed in a resin.

19. The device according to claim 18, wherein the light emitting element emits light having a wavelength of 380 nm to 420 nm.

20. The device according to claim 14, further comprising a transparent resin layer formed between the second red fluorescent layer and the green fluorescent layer.

* * * * *